United States Patent [19]

Shinozaki et al.

[11] 4,264,713
[45] Apr. 28, 1981

[54] PROCESS OF PRODUCING A LITHOGRAPHIC PRINTING PLATE

[75] Inventors: Fumiaki Shinozaki; Tomoaki Ikeda; Sadaharu Ikeda, all of Asaka; Chiaki Osada, Odawara, all of Japan

[73] Assignee: Fuji Photo Film Co., Ltd., Minami-ashigara, Japan

[21] Appl. No.: 35,969

[22] Filed: May 4, 1979

Related U.S. Application Data

[63] Continuation of Ser. No. 818,030, Jul. 22, 1977, abandoned, which is a continuation of Ser. No. 632,593, Nov. 17, 1975, abandoned.

[30] Foreign Application Priority Data

Nov. 14, 1974 [JP] Japan ................................. 49-131829

[51] Int. Cl.$^3$ ............................................... G03C 5/00
[52] U.S. Cl. .................................... 430/302; 430/281; 430/287; 430/306
[58] Field of Search .................. 96/115; 430/281, 287, 430/302, 306, 322

[56] References Cited

U.S. PATENT DOCUMENTS

| | | | |
|---|---|---|---|
| 3,647,470 | 3/1972 | Tauda | 96/115 R |
| 3,775,112 | 11/1973 | Alsup et al. | 96/115 R |
| 3,799,915 | 3/1974 | Dunnavant et al. | 96/115 R |
| 3,864,308 | 2/1975 | Kato et al. | 96/115 R |
| 3,881,935 | 5/1975 | Apellaniz | 96/115 R |

*Primary Examiner*—Jack P. Brammer
*Attorney, Agent, or Firm*—Sughrue, Rothwell, Mion, Zinn and Macpeak

[57] ABSTRACT

A light-sensitive lithographic printing plate comprising a support and a layer of a light-sensitive composition thereon consisting of a light-sensitive polymer containing a —CH=CHCO— unit in its main chain and a light-sensitive polymer containing a —CH=CHCO— unit in its side chain(s).

7 Claims, No Drawings

PROCESS OF PRODUCING A LITHOGRAPHIC PRINTING PLATE

This is a continuation of application Ser. No. 818,030 filed July 22, 1977, now abandoned, which is in turn a continuation of Ser. No. 632,593, filed Nov. 17, 1975, now abandoned.

BACKGROUND OF THE INVENTION

1. Field of the Invention

The present invention relates to a light-sensitive lithographic printing plate. More particularly, the present invention is concerned with a light-sensitive lithographic printing plate which is improved in ease of development in which a light-sensitive layer is subjected to imagewise exposure and then soluble areas of the light-sensitive layer are removed with a solvent (hereinafter referred to as developability), and in more preferred embodiments, which is developable with an alkaline aqueous solution without using any organic solvent.

2. Description of the Prior Art

Hydrophilic areas and oleophilic areas are formed on the surface of a lithographic printing plate, the hydrophilic areas being non-image areas and the oleophilic areas being image areas. In printing, the hydrophilic areas are first moistened with water to make them ink-repellent, the oleophilic areas are then inked, and the ink on the printing surface is transferred through offset rollers (blankets) to a receiving surface. Hitherto, light-sensitive materials have been used in producing light-sensitive layers photographically, producing the hydrophilic areas and the oleophilic areas according to the printing images desired on the lithographic printing plate. As light-sensitive materials for use in a negative type plate wherein exposed areas of the light-sensitive layer are made oleophilic and unexposed areas of the light-sensitive layer are made hydrophilic or removed by a solvent (in this case, upon removal of the areas the hydrophilic layer previously provided under the light-sensitive layer is exposed). Examples of such materials include a condensate of p-diazophenylamine and formaldehyde as described in West German Pat. No. 596,731, and derivatives thereof; 3-nitroanthranyl acid as described in U.S. Pat. No. 2,729,562; diazo derivatives of aromatic or heterocyclic amines as described in West German Pat. No. 949,383; reaction products of polysulfonic acid salts and diazonium salts as described in U.S. Pat. No. 2,890,115; an acrylic acid ester of pentaerythritol as described in Japanese Patent Publication No. 32714/1971; polyvinylcinnamic acid as described in U.S. Pat. No. 3,357,831; etc.

Recently, various materials exhibiting phenomena such as photo-crosslinking, photo-polymerization, etc., have been developed, and some of these materials are now in practical use. Of these materials, light-sensitive materials exhibiting photo-crosslinking are those polymers whose light-sensitivity is provided by introducing —CH=CHCO— units into the main chain of a polymer such as a polyester, polycarbonate, polysulfonate, etc., at the time of producing these polymers. While light-sensitive lithographic printing plates produced using these light-sensitive polymers are highly sensitive and have a sharp sensitivity curve (high $\gamma$), they suffer from the defect that developability is poor. Therefore, while one might consider removing this defect by blending these polymers with other polymers, the compatibility of these polymers with other polymers is extremely poor and polymers which are mutually soluble with these light-sensitive polymers are very limited. Though there are some other polymers mutually soluble with these light-sensitive polymers, the compositions produced by blending them do not exhibit highly improved properties.

SUMMARY OF THE INVENTION

Due to the inventor's continuous investigations on various kinds of light-sensitive polymers and the above described light-sensitive polymers containing —CH=CHCO— units in their main chain, it has now been found that the above described defect of light-sensitive polymers containing —CH=CHCO— units in their main chain, i.e., poor developability, can be removed.

The present invention provides light-sensitive lithographic printing plates comprising a support and one or more layers of a light-sensitive composition comprising one or more light-sensitive polymers containing at least one —CH=CHCO— unit in their main chain and one or more light-sensitive polymers containing at least one —CH=CHCO— unit in their side chain(s) provided on the support.

DETAILED DESCRIPTION OF THE INVENTION.

Light-sensitive polymers containing —CH=CHCO— units in their main chain as used herein are well known as described above. Polyester based polymers with —CH=CHCO— units introduced into their main chain can be produced by condensing lower alkyl esters of polybasic carboxylic acids or chlorides thereof, and a polyhydric alcohol in the presence of an esterification catalyst.

Polycarbonate based polymers can be produced by reacting a polyhydric alcohol and phosgene, or by reacting a bischloroformate of a polyhydric alcohol with another polyhydric alcohol. Polysulfonate based polymers can be produced in a similar manner. In these cases, the —CH=CHCO— units incorporated into the main chain of the polymers are incorporated into the main chain of the polybasic carboxylic acid or polyhydric alcohol used prior to polymer formation, and thus, after polymerization or polycondensation, these units become —CH=CHCO— units in the main chain of the polymer finally obtained.

Polybasic carboxylic acids, the starting materials of such light-sensitive materials, include p-phenylenediacrylic acid, fumaric acid, succinic acid, cinnamic acid, citric acid, adipic acid, phthalic acid, terephthalic acid, ascorbic acid, aconitic acid, maleic acid, lactic acid, and the like. The polyhydric alcohols used include ethylene glycol, diethylene glycol, triethylene glycol, propylene glycol, butylene glycol, hexamethylene glycol, thiodiglycol, oxyalkylated ($C_2$-$C_{15}$ alkyl group) thiodiglycol, neopentyl glycol, trimethylol propane, pentaerythritol, sorbitol, mannitol, 1,4-cyclohexane dimethanol, 1,4-di-$\beta$-hydroxyethyloxy cyclohexane, diphenylol propane, tetrachlorodiphenylol propane, dihydroxy chalcone, dihydroxy dibenzalketone, divanillal cyclopentane, 4,4'-dihydroxy chalcone, and the like.

Light-sensitive polymers containing —CH=CHCO— units in their main chain can be synthesized by heating a mixture of the above described polybasic carboxylic acid(s) and polyhydric alcohol(s) (into the main chain of at least one of which has been introduced —CH=CHCO— units) at temperatures of from about 100° C. to about 300° C. while removing the water produced in the reaction system. For this purpose, the condensation system can be under reduced pressure to remove water, or water can be distilled off from the system as an azeotropic mixture. Furthermore, p-toluene sulfonic acid, potassium acetate, or heavy metal salts may be added to the system as dehydrating catalysts.

It is, of course, possible to condense more than one alkyl ester of a polybasic carboxylic acid or chloride thereof with more than one polyhydric alcohol and obtain a useful product, and similar multi-component systems can be used for the polycarbonates and polysulfonates.

Condensates so obtained have a molecular weight of at least about 750, and condensates having a molecular weight of about 1,500 to above 5,000 are preferably used in the present invention. Those polymers containing —CH=CHCO— units in a proportion of about 1 to 30 parts (atomic ratio) based upon 100 parts thereof are preferred.

Preparation examples of light-sensitive polymers containing —CH=CHCO— units in their main chain are shown below.

PREPARATION EXAMPLE 1

The following ingredients were mixed.

| | Parts (by weight) |
| --- | --- |
| Phthalic Anhydride (0.5 mole) | 74 |
| Adipic Acid (0.5 mole) | 73 |
| Cinnamic Acid (1 mole) | 148 |
| Glycerin | 92 |

This mixture was slowly heated on an oil bath to raise the temperature of the contents up to 200° C. Esterification was stopped after 18 hours. The polyester so produced contained only 2.6% hydroxy groups, and its acidity decreased to 46.3. Its molecular weight was 760. A film produced from an acetone solution of this polyester immediately became insoluble upon exposure.

PREPARATION EXAMPLE 2

A mixture of 500 parts (by weight, hereinafter, the same), 220 parts of p-carboxycinnamic acid dimethyl ester, 146 parts of glycol diacetate, and 4 parts of p-toluene sulfonic acid was heated at a temperature of about 80° C. for 18 hours. The molecular weight of the polymer obtained was 2,500. This polymer, when exposed to light, became insoluble in any organic solvent.

Light-sensitive polymers containing —CH=CHCO— units in their side chain(s), which are used in combination with the above described light-sensitive polymers containing —CH=CHCO— units in their main chain to produce compositions of the present invention, are also well known. For example, those polymers containing monomer units having side chains represented by the following chemical formulae can be used. It is believed that atomic bonds in these side chains provide the polymers with light-sensitivity. Preferred polymers have a molecular weight of 2,000 to 20,000 where the —CH=CHCO— units are present at an atomic ratio of 1 to 50 parts (atomic ratio) based on 100 parts of the polymer.

FORMULA 1

wherein $R_1$ is hydrogen, halogen, a nitrile group, or a lower alkyl group, preferably of from 1 to 5 carbon atoms, and in more detail, —CH$_2$CH$_2$—, —CH$_2$CH$_2$CH$_2$—, —CH$_2$CHCH$_3$—, —CH$_2$CHOHCH$_2$—, —CH$_2$CH$_2$OCH$_2$CH$_2$—, or the like; $R_3$ is an aromatic nucleus, preferably of 6 to 14 carbon atoms, e.g., phenyl, naphthyl, anthryl, etc., which may be substituted by substituents such as a nitro group, a halogen atom, an alkoxy group, an azido group, a sulfo azide group, or the like, and l is 1 or 2.

FORMULA 2

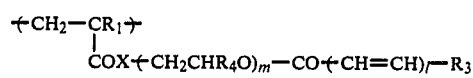

wherein $R_1$, $R_2$, and l are the same as defined in Formula 1; X is —O— or —NH—; $R_4$ is a hydrogen atom or lower alkyl group containing 1 to 6 carbon atoms; and m is an integer of 1 to 4.

FORMULA 3

wherein $R_1$, $R_3$, X and l are the same as defined in Formulae 1 and 2; and n is an integer of 1 through 6.

In addition, light-sensitive resins produced from furylacrylic acid containing a furylacryl group such as polyvinyl furylacrylate can be used, as disclosed in Japanese Patent Publication No. 14630/74.

As one method of producing such light-sensitive resins, producing esters from polyvinyl alcohol has been used. Recently, a polymer synthesizing method in which monomers with —OCH$_2$CH$_2$— units or

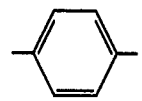

units introduced between vinyl groups and cinnamoyl groups are subjected to cationic polymarixation (see *Journal of Polymer Science*, Part B, Vol. 7, page 608 (1969)), and a method in which monomers containing different esters in their molecluos and containing cinnamic acid or β-(2-furyl)acrylic acid are polymerized (see Japanese Patent Laid Open 32813/1972), have been reported. In accordance with these methods, the above monomers and other monomers can be easily copolymerized, e.g., acrylic acid, ethyl acrylate, methyl methacrylate, acrylonitrile, acrylamide, vinyl chloride, vinylidene chloride, vinyl acetate, styrene, αmethylstyrene, p-methoxystyrene, isobutyl vinyl ether, phenyl vinyl ether, acrylic glycidyl ether, etc.

In accordance with a further method, ester polymers containing acrylic acid hydroxy groups represented by the following formula:

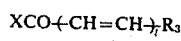

wherein $R_1$ is the same as defined above, and $R_5$ is an aliphatic group, preferably of 6 to 14 carbon atoms, containing a hydroxy group, and acid halides represented by the following formula:

$$XCO-(-CH=CH-)_l R_3$$

wherein X is a halogen atom, and $R_3$ and $l$ are the same as defined above,
are reacted in the homogeneous or heterogeneous system, if desired, with the above "other monomers," i.e., acrylic acid, etc. Suitable examples of acrylic acid hydroxy group-containing ester polymers are homopolymers of 2-hydroxyethyl acrylate, 2-hydroxypropyl acrylate, 3-hydroxypropyl acrylate, 2-hydroxyethyl methacrylate, 2-hydroxypropyl methacrylate, 3-hydroxypropyl methacrylate, 2-hydroxyethyl-α-chloro acrylate, 2-hydroxyethyl-α-cyano acrylate, 2-hydroxypropyl-α-chloro acrylate, diethylene glycol monoacrylate, diethylene glycol monomethacrylate, 2,3-dihydroxypropyl acrylate, and the like, and copolymers of the above monomers and up to about 50 mole % of another vinyl compound(s) such as acrylic acid, alkyl acrylates, e.g., ethyl acrylate, and the like, methyl methacrylate, acrylonitrile, acrylic acid amide, vinyl chloride, vinylidene chloride, vinyl acetate, styrene, α-methyl styrene, p-methoxystyrene, isobutyl vinyl ether, 2-chloroethyl vinyl ether, phenyl vinyl ether, allyl glycidyl ether, butadiene, isoprene, chloroprene, and the like.

On the other hand, suitable examples of acid halides include cinnamic acid chloride, m-nitrocinnamic acid chloride, p-chlorocinnamic acid chloride, p-methoxycinnamic acid chloride, α-cyanocinnamic acid chloride, cinnamylidene acetic acid chloride, α-cyanocinnamylidene acetic acid chloride, β-(1)-naphthyl acrylic acid chloride, β-(2)-naphthyl acrylic acid chloride, β-(2)-furfuryl acrylic acid chloride, β-(2)-furfuryl-α-cyano acrylic acid chloride, β-(2)-thienyl acrylic acid chloride, and the like, e.g., similar bromides, iodides and fluorides.

Acrylate polymers containing the units represented by the above formula can also be produced by condensing a polymer containing halogenomethyl groups in their aliphatic side chains, and carboxylic acid salts represented by the following formula:

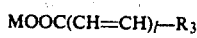

wherein $R_3$ and $l$ are the same as defined above, and M is an ammonium group or an alkali metal, in a non-protonic polar solvent (see Japanese Patent Publication No. 14630/74). As polymers containing halogenomethyl groups in their aliphatic side chains, homopolymers of 2-chloroethyl acrylate and the like, and copolymers of 2-chloroethyl acrylate and the like, and the above described "other vinyl compounds" can be used. As the carboxylic acid salt, ammonium salts, sodium salts, potassium salts, and the like of carboxylic acid corresponding to the above described acid halides, can be used.

The thus produced acrylate polymer contains light-sensitive

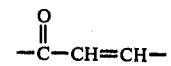

groups in an amount of 40-80% based on the repeating units of the monomer containing halogenomethyl groups in its aliphatic side chains.

From acrylate polymers produced by these methods, polymers completely esterified with ester groups containing light-sensitive groups can be easily produced.

Preparation examples of various light-sensitive polymers will now be given.

PREPARATION EXAMPLE 1

19 g of β-hydroxyethyl methacrylate was dissolved in 46 g of pyridine. To the resulting solution, 25 g of cinnamic acid chloride was gradually added with vigorous stirring while chilling the reaction vessel with ice water. After the addition was completed, the reaction was continued at room temperature for 8 hours whereafter, 200 ml of water was added to the system and the liquid which separated extracted with ether to extract β-cinnamoyloxyethyl methacrylate. Subsequently, the ether layer was washed with a dilute hydrochloric acid aqueous solution and water in this order.

The ether phase was dried over anhydrous Glauber's salt and filtered, and then the ether was distilled off under reduced pressure without applying heat. 33 g of a pale yellow, liquid material was obtained. Elemental analysis, IR spectral analysis, and NMR spectral analysis showed that the product obtained was β-cinnamoyloxyethyl methacrylate.

| Elemental Analysis | | |
|---|---|---|
| | Found (%) | Calculated (%) |
| C | 70.01 | 69.21 |
| H | 6.22 | 6.20 |
| NMR Analysis | | |
| Peak | Proton | Number of H |
| 7.4 ppm | benzenering proton | 5 |
| 7.6 ppm, 6.35 ppm | olefin proton | 2 |
| 6.05 ppm, 5.5 ppm | vinyl proton | 2 |
| 4.3 ppm | methylene proton | 4 |
| 1.9 ppm | methyl proton | 3 |
| IR Analysis | | |
| Peak (cm$^{-1}$) | | Interpretation |
| 1720 and 1730 | | ester |

8 g of β-cinnamoyloxyethyl methacrylate was dissolved in 55 g of tetrahydrofuran, to which 100 mg of azobisisobutyronitrile was added. The resulting mixture was stirred in a nitrogen atmosphere for about 3 hours at 25° C. and atmospheric pressure. After this time, the reaction mass was dropped into n-hexane to separate a white polymer. The polymer was filtered, and obtained in an amount of 6.5 g.

The thus obtained product was poly-β-cinnamoyloxyethyl methacrylate. The viscosity of the compound was η splc=0.580 dl/g.

Infrared analysis indicated the ester absorption at 1720 cm$^{-1}$ and 1730 cm$^{-1}$.

PREPARATION EXAMPLE 2

8 g of β-cinnamoyloxyethyl methacrylate and 2 g of methacrylic acid were dissolved in 10 g of methyl ethyl ketone and 20 g of dioxane. After the addition of 150 mg of N,N'-azobisisobutyronitrile, the reaction mass was reacted with stirring at 60° C. under a nitrogen atmosphere for about 5.5 hours, whereafter 500 ml of n-hexane was poured into the reaction system to separate the reaction product.

The product was filtered and dried, and about 9.8 g of a white polymer was obtained. The intrinsic viscosity of the polymer in tetrahydrofuran at 30° C. was $[\eta]=0.312$ dl/g.

PREPARATION EXAMPLE 3

75 g of 2-hydroxyethyl acrylate (HEA) was dissolved in 140 ml of hexamethylphopholamide (HMPA), to which 0.08 g of azobisisobuty onitrile (ABIN) was then added. The resulting mixture was polymerized at 1 atm at 60° C. for 1 hour, and then at 80° C. for 2 hours. Poly-2-hydroxyethyl acrylate (PHEA) of $[\eta]=1.18$ was obtained.

7.5 g of the PHEA obtained above was dissolved in 100 ml of HMPA, and 12.9 g of cinnamic acid chloride dissolved in 50 ml of HMPA was added thereto with stirring. The resulting mixture was reacted at 50° C. for 5 hours at 1 atm. After this reaction time, the reaction solution was added to 1.5 liter of water to precipitate the polymer. The precipitated polymer was separated from the water and then dissolved in 200 ml of acetone, separated therefrom, and added to 1.5 liter of water to reprecipitate the polymer. 9.0 g of the cinnamic acid ester of PHEA (Tg 31.5° C.) was thus obtained. Elemental analysis, IR analysis, and NMR analysis confirmed that the product was completely esterified.

PREPARATION EXAMPLE 4

150 g of 2-hydroxypropyl acrylate (HPA) was dissolved in 140 ml of HMPA, to which 0.10 g of ABIN (azobisisobutyronitrile) was added. The resulting mixture was polymerized at 60° C. for 1 hour at 1 atm, and then at 80° C. for 1 hour. Poly-2-hydroxypropyl acrylate (PHPA) of $[\eta]=1.27$ was obtained.

7.5 g of PHPA obtained as above was dissolved in 100 ml of HMPA, and 11.5 g of cinnamic acid chloride dissolved in 50 ml of HMPA then added thereto with stirring. The resulting mixture was reacted at 50° C. for 5 hours at 1 atm, whereafter, the reaction solution was added to 1.5 liter of water to precipitate the polymer. The polymer was separated therefrom and dissolved in 200 ml of tetrahydrofuran and added to 1.5 liter of water to re-precipitate the polymer. 11.3 g of the cinnamic acid ester of PHPA (Tg 17° C.) was obtained. Elemental analysis, IR analysis, and NMR analysis confirmed that the polymer was completely esterified.

PREPARATION EXAMPLE 5

21.0 g of HEA, and 1.7 g of vinyl acetate (VAc) were dissolved in 25 ml of HMPA, and then 0.023 g of ABIN was added thereto. The resulting mixture was reacted at 60° C. for 4 hours at 1 atom.

A 2-hydroxyethyl acrylate-vinyl acetate copolymer [P(HEA-VAc)] of $[\eta]=1.35$ was obtained at a stoichiometric ratio in the copolymer the same as the starting components.

75 ml of HMPA, and then 36.0 g of cinnamic acid chloride dissolved in 50 ml of HMPA were added to this reaction solution, and 18 ml of pyrydine added thereto. The resulting mixture was reacted at 50° C. for 5 hours, whereafter the reaction solution was added to 3 liter of methanol to precipitate the polymer. The polymer was again dissolved in 150 ml of methyl ethyl ketone and added to 3 liter of methanol, whereby the polymer was reprecipitated. 25.8 g of the cinnamic acid ester of P(HEA-VAc) was thus obtained.

PREPARATION EXAMPLE 6

Following the procedure of Preparation Example 3, 22.0 g of HEA and 0.9 g of VAc were used, and thus 26.2 g of the cinnamic acid ester of P(HEA-VAc) was obtained.

PREPARATION EXAMPLE 7

11.6 g of the PHEA obtained in Preparation Example 3 was dissolved in 100 ml of HMPA, and then 2.28 g of phenyl monoisocyanate dissolved in 10 ml of HMPA was added with stirring. The resulting mixture was reacted at room temperature for 3 hours at 1 atm. After this reaction time, 14.2 g of cinnamic acid chloride dissolved in 10 ml of HMPA, and 5 ml of pyridine were added thereto, and the system reacted at room temperature for 6 hours at 1 atm. After the reaction was completed, the reaction solution was added to 1 liter of methanol to precipitate the polymer. The polymer was again dissolved in 50 ml of methyl ethyl ketone, and then added to 1.5 liter of methanol, whereby the polymer was re-precipitated. Thus, 18.0 g of the cinnamic acid ester of PHEA whose side chains were partly (about 20 mole %) urethanated was obtained.

PREPARATION EXAMPLE 8

4.5 g of the PHEA obtained in Preparation Example 3 was dissolved in 60 ml of HMPA, and then 9.0 g of cinnamylidene acetic acid chloride dissolved in 30 ml of HMPA was added thereto. The resulting mixture was reacted at 50° C. for 5 hours at 1 atm, whereafter the reaction solution was added to 2 liters of water to precipitate the polymer. This polymer was again dissolved in 200 ml of acetone and then added to 2 liter of methanol, whereby the polymer was re-precipiated.

5.4 g of the cinnamylidene acetic acid ester of PHEA was thus obtained.

PREPARATION EXAMPLE 9

6.73 g of poly(2-chloroethyl acrylate) and 1.0 g of methyltriethylammonium iodide was dissolved in 70 ml of HMPA, and 9.3 g of potassium cinnamate were added, the resulting mixture was reacted at 100° C. for 10 hours, whereafter the reaction solution was added to 2 liters of water to precipitate the polymer. This polymer was again dissolved in 100 ml of methyl ethyl ketone and then added to 2 liters of water, whereby the polymer was reprecipitated. 11.0 g of a polymer having the same structure as the cinnamic acid ester of PHEA was thus obtained. Measurement of the degree of esterification of the polymer produced was conducted by determining the amount of unreacted chlorine contained in each monomer unit remaining in the product by microhalogen analysis. The degree of esterification was 0.98.

PREPARATION EXAMPLE 10

5 g of polymethylvinyl ketone was dissolved in 100 g of glacial acetic acid, and then 26 g of benzaldehyde was added thereto. Subsequently, 1 g of concentrated sulfuric acid and 10 g of glacial acetic acid were added thereto. The resulting mixture was reacted with stirring in the dark, and allowed to stand at room temperature for 72 hours. After the reaction was completed, anhydrous sodium acetate was added in an amount sufficient to neutralize the concentrated sulfuric acid, and then the reaction solution was dropped into 300 ml of ethanol, whereby a pale yellow resin was obtained. After filtration, the resin was washed with ethanol, dried in vacuum, and stored in the dark.

PREPARATION EXAMPLE 11

Production of polyvinyl-p-dimethylaminostyryl ketone 5 g of polymethylvinyl ketone was dissolved in 100 g of glacial acetic acid, and then 21 g of p-dimethylaminobenzaldehyde was added thereto. Subsequently, 1 g of concentrated sulfuric acid and 10 g of glacial acetic acid were added thereto. The resulting mixture was reacted with stirring in the dark, and allowed to stand at room temperature for 23 hours. After the reaction was completed, anhydrous sodium acetate in an amount sufficient to neutralize the concentrated sulfuric acid was added, and then the above reaction mixture was dropped into 300 ml of methanol, whereby a resin was obtained. After filtration, the resin was washed with methanol and dried in vacuum,

PREPARATION EXAMPLE 12

Production of polyvinyl-p-methoxystyryl ketone 5 g of polymethylvinyl ketone was dissolved in 100 g of glacial acetic acid, and then 34.6 g of anisaldehyde was added thereto. Subsequently, 1 g of concentrated sulfuric acid and 10 g of glacial acetic acid were added thereto. The resulting mixture was reacted in the dark, and allowed to stand at room temperature for 24 hours. After the reaction was completed, anhydrous sodium acetate was added to neutralize the reaction solution, and the reaction solution was dropped into 300 ml of methanol, whereby a resin was obtained.

After filtration, the resin was washed with methanol and dried in vacuum.

PREPARATION EXAMPLE 13

Production of Poly(sodium methylvinylketone-2-sulfonate)

5 g of polymethylvinyl ketone and 27 g of sodium benzaldehyde-2-sulfonate were dissolved in a mixed solvent of 50 ml of 2-methoxyethanol and 10 ml of dioxane, and then 2 g of 40% trimethylbenzylammonium hydroxide was added thereto. The resulting mixture was allowed to stand at room temperature for 72 hours. After reaction, glacial acetic acid was added, and the above reaction mixture poured into 50 ml of water, whereby yellow precipitates were obtained. The precipitates were filtered, washed with ethanol, dried in vacuum, and dissolved in ethylene glycol monomethyl ether. After the addition of a sodium hydroxide solution, the solvents were evaporated, and a water-soluble resin was obtained.

Light-sensitive polymers containing —CH=CH-CO— units in their side chain(s) produced by the above methods are mixed with light-sensitive polymers containing —CH=CHCO— units in their main chain in accordance with the present invention. One or more light-sensitive polymers are selected from the light-sensitive polymers of each group. They are mixed in such a manner that the light-sensitive polymer(s) containing —CH=CHCO— units in its their side chain(s) are present in a proportion of about 1 to about 10,000 parts by weight, preferably about 10 to 1,000 parts by weight, per 100 parts by weight of the light-sensitive polymer(s) containing —CH=CHCO— units in its their main chain. Where the ratio is above the upper limit, the sensitivity of light-sensitive compositions is reduced, which is undesired from the point of printing plate-making. On the other hand, where the ratio is below the lower limit, developability is deteriorated. However, these limits will vary depending upon kind and degree of polymerization of the light-sensitive polymers used, the combinations of polymers, the kind of developers used, and other factors, thus, the above limits have been generally determined.

The thus prepared light-sensitive polymer compositions are generally soluble in solvents such as acetone, methyl ethyl ketone, methyl isobutyl ketone, cyclohexanone, methyl cellosolve acetate, dimethylformamide, hexamethylphosphoramide, tetrahydrofuran, chlorobenzene, triethylene glycol, and the like, whereas they are insoluble in solvents such as alcohols, hydrocarbons, and the like.

These compositions are usually dissolved in a solvent as described above (a single solvent or mixed solvent consisting of two or more organic solvents is selected) to prepare a coating solution. In this case, if sensitizers, e.g., 5-nitroacenaphthene, N-acetyl-4-nitro-1-naphthylamine, 4,4'-bis(dimethylamino)benzophenone, 2-chloro-4-nitroaniline, p-nitrodiphenyl, α-nitronaphthalene, 1-acetylamino-4-nitronaphthalene, 2,6-dichloro-4-nitroaniline, 2,4,6-trinitroaniline, 6-nitrobenzoimidazole, 2-nitrofluorene, 2,4,7-trinitrofluorene, 1,8-phthaloylnaphthalene, 4-chloro-1,8-phthaloylnaphthalene, p-nitroaniline, 1,2-benzoanthraquinone, bis-[4-(methylamino)phenyl] keton, (3-methyl-1,3-diaza-1,9-benz-)anthronepichlamide, N-methyl-2-benzoylmethyl-$\beta$-naphthothiazole, and the like are added to the coating solution in an amount of about 0.01 to 15% based upon the weight of the polymers, light-sensitivity is markedly increased.

In addition, if desired, various conventional additives such as dyes, pigments, fillers, printing ability-improving agents, oleophilicity-improving agents, auxiliary bonding agents, and the like can be added to the coating solution.

The thus prepared coating solution of the light-sensitive polymer composition is adjusted in vicosity, if needed, so that it can be applied by conventional coating methods, and is coated by any conventional coating method such as dip coating, curtain coating, roll coating, spray coating, air knife coating, doctor knife coating, and the like.

The support on which coating solution is coated must have at least one surface which is hydrophilic and excellent in bonding strength with the light-sensitive polymer layer, must not exert any chemical influence on the light-sensitive polymer, must be even and free from scratches, and must have good dimensional stability, as will be apparent to one skilled in the art. Suitable examples of materials which can be used as supports, are metal plates such as an aluminum plate, a stainless steel plate, a zinc plate, and other metal plates; sheets or plates of synthetic resins such as polyethylene terephthalate, polycarbonate, polypropylene, cellulose derivates, and the like; paper on which a molten synthetic resin has been coated or a synthetic resin solution coated; composite materials in which metal layers are provided on synthetic resins by techniques such as vacuum-vapor deposition, lamination, electroless plating, and the like; and other materials hitherto used as supports for lithographic printing plates.

As is well known, the basis of lithographic printing plates resides in that hydrophilic surfaces are present under oleophilic images, and thus with any of the above materials, their surfaces should be hydrophilic, or hydrophilic layers should be provided on at least one surface of the support. For example, in the case of metal plates, a conventional graining, liquid foaming, electrolytic processing, or the like can be used to provide a moisture-receptive property to the surface, and in the case of a polyethylene terephthalate film, its surface can be made hydrophilic by coating thereon a layer containing gelatin, or with a cellulose derivative its surface can be made hydrophilic by saponifying the surface with an alkaline solution. In the case of any support, there is some method of rendering at least one surface thereof hydrophilic, and supports of the present invention include those rendered hydrophilic by such processing.

Where hydrophilic layers are formed on synthetic resin supports, if they are subjected to a conventional corona discharge processing, flame processing, ultraviolet irradiation processing, etc., the bond strength between the hydrophilic layer and the support is greatly strengthened. As necessary, the support may be provided with an adhesive layer, anti-halation layer, or a layer having both capabilities.

The above light-sensitive polymer composition is coated on the support in an amount to provide a dry thickness ranging from about 0.1 to about 10μ, preferably about 0.5 to about 3μ.

After coating, the coating solution is dried by a conventional method, and the resulting plate is cut to the desired dimensions of the light-sensitive lithographic printing plate. In producing a lithographic printing plate from such a plate, the plate is initially exposed to light, e.g., a super high voltage mercury lamp, metal halide lamp, high voltage mercury lamp, xenon lamp, etc., through a negative image to harden exposed areas of the light-sensitive layer, thereby rendering the exposed areas insoluble, and then uncured, unexposed areas are dissolved and removed (developed) with an organic solvent, e.g., benzyl alcohol, butyl cellosolve, butyl-β-hydroxyethyl ether, methyl cellosolve, methyl-β-hydroxyethyl ether, butyl lactone, diethylene glycol ethyl ether, etc., preferably an aqueous alkaline solution, to expose the oleophilic surface of the support.

Since the course of producing lithographic printing plates from these light-sensitive lithographic printing plates is the same as conventional ones, detailed explanation is believed necessary. The subsequent printing procedures of moistening with water, inking, and printing are also conventional.

The present invention is quite useful in that the light-sensitive lithographic printing plates of the present invention can be developed with aqueous alkaline solutions, their sensitivity is as high as conventional plates, and the process of producing printing plates from light-sensitive lithographic printing plates in which the light-sensitive polymers are used can be simplified. The use of organic solvents for development should be reduced as much as possible to reduce the danger of fire and the hazard to humans by inhalation; to reduce the equipment for the developing unit and organic solvent-recovering equipment; and to reduce the need for the storage and handling of organic solvents; etc. Thus, the excellent effects and advantages of the present invention that excellent lithographic printing plates can be produced without using any organic solvent are clear.

Hereinafter, lithographic printing plate materials of the present invention will be explained in detail by reference to several examples of preferred embodiments of the invention.

EXAMPLE 1

A degreased 3S18H class aluminum plate having a thickness of about 3 mm was dipped in approximately 20% by weight dilute sulfuric acid (liquid temperature about 30° C.), and the surface of the aluminum plate was subjected to anodic oxidation using an electric density of 3 A/dm$^2$ for 2 minutes. The aluminum plate was then taken out, washed with water, and dried. On the aluminum plate there was coated the following light-sensitive composition (coating solution) to a thickness of 2μ (dry basis), which was then dried at a temperature of 80° C. for 3 minutes.

Component A: A condensate of p-phenylenediacrylic acid and 1,4-bis(β-hydroxyethoxy)cyclohexane ($[\eta]=0.15$) as a polymer containing a —CH=CHCO— unit in its main chain (1:1 molar ratio).

Component B: Poly(β-cinnamoyloxyethyl methacrylate/methacrylic acid) (polymerization molar ratio 90/10: $[\eta]=0.14$) as a polymer containing a —CH=CHCO— unit in its side chain (30% methacrylic acid based on repeating units (corresponding to the monomer) of β-cinnamoyloxyethyl methacrylate and methacrylic acid).

The above operation was repeated using several compositions in which the mixing ratio of Components A and B was changed as shown in Table 1. In each case, the solvent used in the coating solution was a mixed solvent of 12 g of 1,2-dichloroethane and 6 g of methyl cellsolve, and to the coating solution was added N-methyl-2-benzoylmethylene-β-naphthothiazole as a sensitizing agent in an amount of 8% by weight, based upon the total weight of Components A and B.

The thus obtained light-sensitive lithographic printing plates were exposed to light at their light-sensitive surfaces, and then developed with an alkali developer having the following composition. In carrying out the image-wise exposure, "Jet Printer 2000" (printer produced by Oak Manufacturing Co.) having a 2 KW super high voltage mercury lamp for print-making was used, a "Fuji PS Step Guide" (trade name of an optical wedge produced Fuji Photo Film Co., Ltd., 15 stages, ΔD=0.15 to 0.2) was used as the original image, and the distance between the light-sensitive surface and the light source was 50 cm.

COMPOSITION OF DEVELOPER

| | Quantity |
|---|---|
| Sodium Silicate | 12.5 g |
| Butyl Cellosolve | 20 g |
| Benzyl Alcohol | 10 g |
| "Nikkol"OP-30 | 15 cc |
| (trade name, produced by Nikko Chemical Co., Ltd.) | |
| Water to make | 1 liter |

When the images produced were observed, the results shown in Table 1 were obtained.

Table 1

| Sample | Component A (g) | Component B (g) | Wedge step developed (steps) |
|---|---|---|---|
| 1 | 0 | 1.0 | 3 |
| 2 | 0.1 | 1.0 | 4 |
| 3 | 0.4 | 1.0 | 5 |
| 4 | 0.7 | 1.0 | 6 |
| 5 | 1.0 | 1.0 | 8 |
| 6 | 1.0 | 0.8 | 9 |
| 7 | 1.0 | 0.6 | 10 |
| 8 | 1.0 | 0.4 | 10 |
| 9 | 1.0 | 0.2 | 10 |
| 10 | 1.0 | 0.1 | 10 |
| 11 | 1.0 | 0 | Impossible to develop |

As is shown in Table 1, in the case of Sample 1 in which Component B, i.e., a light-sensitive polymer containing a —CH=CHCO— unit in its side chain, was used alone, sensitivity was very low, and the wedge step was 3 steps at the best; furthermore, the sensitivity curve showed a low γ. However, it was confirmed that those compositions containing Component A, i.e., a light-sensitive polymer containing a —CH=CHCO— unit in its main chain, were greatly improved in sensitivity. In the case of Sample 11, in which Component A alone was used, it was impossible to develop with the developer having the above described composition. Those compositions in which Components A and B coexisted provided light-sensitive lithographic printing plates having excellent properties.

Sample 5 in which Components A and B were used in equal amount, was mounted on a Hamadastar 500 CD printing machine and used to print fifty thousand sheets. Thus, it was confirmed that Sample 5 was an excellent lithographic printing plate material.

EXAMPLE 2

Following the procedure of Example 1, there was coated a light-sensitive coating solution having the following composition on the same aluminum plate as was used in Example 1 at a dry thickness of 2μ, which was then dried as in Example 1 to produce a light-sensitive lithographic printing plate.

| | |
|---|---|
| Poly β-cinnamoyloxyethyl Methacrylate [η] = 0.14 | 1 g |
| Polymer of p-Phenylenediacrylaic Acid and 1,4-Bis(β-hydroxyethoxy)cyclohexane [η] = 0.15 | 1 g |
| N-Methyl-2-benzoylmethylene-β-naphthothiazole (Sensitizing Agent) | 140 mg |
| 1,2-Dichloroethane (Solvent) | 12 g |
| Methyl Cellosolve Acetate (Binder) | 6 g |

In the above, β-cinnamoyloxyethyl methacrylate is a monomer having one ester bond, the cinnamoyl residue and the methacrylic residue thereof each have one ethylenically unsaturated double bond, so the monomer has two unsaturated double bonds. This monomer is polymerized at the methacrylic residue to form a chain structure, where the β-cinnamoyloxyethyl residue is ester-bonded to the carboxy residue.

The polymer of p-phenylenediacrylic acid and 1,4-bis(β-hydroxyethoxy)cyclohexane is a linear polymer. Accordingly, both are present at a 1:1 molar ratio.

This lithographic printing plate material was image-wise exposed in the same manner as in Example 1, and then developed with butyl lactone. The wedge step developed was 6 steps, and thus the material showed excellent developability. This material was used for the same printing as described in Example 1, and provided fifty thousand sheets of excellent quality.

EXAMPLE 3

On an aluminum plate as was used in Example 1 there was coated a light-sensitive coating solution having the following composition at a dry thickness of 2μ, which was then dried as in Example 1 to produce a lithographic printing plate material.

| | |
|---|---|
| Poly-β-cinnamoyloxyethyl Methacrylate [η] = 0.14 | 1 g |
| Condensate of p-Phenylenediacrylic Acid and 1,4-Bis(β-hydroxyethoxy)cyclohexane [η] = 0.15 (1:1 molar ratio) | 1 g |
| Nitroacenaphthene | 140 mg |
| 1,2-Dichloroethane | 12 g |
| Methyl Cellosolve Acetate | 6 g |

From this light-sensitive lithographic printing plate, a lithographic printing plate could be produced, which was excellent in printing durability.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate improved in ease of development in an organic solvent or an aqueous alkaline solution which comprises:

coating a support with a light-sensitive composition comprising:

(A) a condensate of p-phenylene diacrylic acid or a chloride thereof and 1,4-bis(β-hydroxyethoxy)cyclohexane having a molecular weight of about 750 to 5,000 said polymer (A) itself showing poor developability in an organic solvent or an aqueous alkaline solution; and (B) at least one polymer having a molecular weight of about 2,000 to 20,000 selected from the group consisting of polymers represented by the following formula (i);

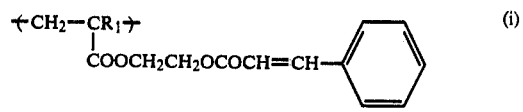

wherein $R_1$ is hydrogen or a methyl group, and copolymers thereof with a comonomer selected from the group consisting of acrylic acid, methacrylic acid and the methyl esters thereof; said copolymer containing —CH=CHCO— units in its side chains in an amount of 1 to 30 parts by weight per 100 parts by weight of said copolymer, said polymer (B) being present in an a proportion of about 10 to 1,000 parts by weight per 100 parts by weight of said polymer (A);

drying the thus coated support;

image-wise exposing the resulting dried layer to light to thereby cure and render insoluble exposed areas and leave unexposed areas uncured and soluble; and removing the unexposed areas by dissolving the same in an organic solvent or an aqueous alkaline solution, thereby forming said lithographic printing plate.

2. The process according to claim 1, wherein said light-sensitive polymer (B) is poly-β-cinnamoyloxyethyl methacrylate.

3. The process according to claim 1, wherein said light-sensitive polymer (B) is poly(β-cinnamoyloxyethyl methacrylate/methacrylic acid).

4. The process according to claim 1, wherein said light-sensitive polymer (A) has a molecular weight of about 1,500 to about 5,000.

5. The process of claim 1, wherein said light-sensitive polymer (B) is a β-cinnamoyloxyethyl methacrylate copolymer.

6. The process of claim 5, wherein said copolymer is with methacrylic acid.

7. The process of claim 5, wherein said copolymer is with acrylic acid.

* * * * *